(12) United States Patent
Kaku et al.

(10) Patent No.: US 9,736,965 B2
(45) Date of Patent: Aug. 15, 2017

(54) PLAYBACK DEVICE FOR AIRCRAFT

(71) Applicant: TEAC Corporation, Tokyo (JP)

(72) Inventors: Daisuke Kaku, Tokyo (JP); Koujiro Tanimoto, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 14/851,707

(22) Filed: Sep. 11, 2015

(65) Prior Publication Data

US 2016/0081222 A1 Mar. 17, 2016

(30) Foreign Application Priority Data

Sep. 12, 2014 (JP) ................................. 2014-186679

(51) Int. Cl.
*H05K 7/20* (2006.01)
*H01L 23/467* (2006.01)
*H04N 5/64* (2006.01)

(52) U.S. Cl.
CPC ....... *H05K 7/20154* (2013.01); *H01L 23/467* (2013.01); *H04N 5/64* (2013.01); *H05K 7/20145* (2013.01); *H01L 2924/0002* (2013.01)

(58) Field of Classification Search
CPC . H01L 23/467; H01L 2924/0002; G06F 1/20; H05K 7/20909; H05K 7/20154; H05K 7/20727; H05K 1/0203; H05K 7/20145; H04N 5/64

See application file for complete search history.

(56) References Cited

U.S. PATENT DOCUMENTS

| | | | | |
|---|---|---|---|---|
| 6,442,024 B1 * | 8/2002 | Shih | ........................ | G06F 1/20 165/121 |
| 6,999,312 B1 * | 2/2006 | Garnett | ................. | H01L 23/467 165/80.3 |
| 7,027,299 B2 * | 4/2006 | Wrycraft | ............ | H05K 7/20727 165/185 |
| 7,120,018 B2 * | 10/2006 | Shen | ........................ | G06F 1/20 165/185 |
| 8,811,018 B2 * | 8/2014 | Ikeda | ....................... | G06F 1/20 165/104.33 |
| 2006/0070280 A1 | 4/2006 | Yamamura et al. | | |

(Continued)

FOREIGN PATENT DOCUMENTS

| | | |
|---|---|---|
| EP | 2 410 398 A1 | 1/2012 |
| JP | 11-112177 A | 4/1999 |

OTHER PUBLICATIONS

Extended European Search Report dated Dec. 2, 2015, for corresponding EP Application No. 15184612.8-1902, 7 pages.

*Primary Examiner* — Robert J Hoffberg
*Assistant Examiner* — Hung Dang
(74) *Attorney, Agent, or Firm* — Seed Intellectual Property Law Group LLP

(57) ABSTRACT

A playback device for an aircraft has a casing; a circuit board; a power unit placed away from the circuit board in a first direction; a heat sink attached to the circuit board; a cooling fan that is placed on an opposite side of the power unit with reference to the circuit board and spaced from a periphery of the casing and that sends an exhaust stream to the heat sink; a partition interposed between the circuit board and the power unit; and first outlets for letting out exhaust streams into which an exhaust stream has diverged upon collision against the partition after passing through the heat sink.

5 Claims, 5 Drawing Sheets

(56) References Cited

U.S. PATENT DOCUMENTS

2008/0106866 A1 5/2008 Hori et al.
2012/0020016 A1* 1/2012 Cheng ................... G06F 1/184
　　　　　　　　　　　　　　　　　　　　361/679.48

* cited by examiner

PLAYBACK DEVICE FOR AIRCRAFT

PRIORITY INFORMATION

This application claims priority to Japanese Patent Application No. 2014-186679 filed on Sep. 12, 2014, which is incorporated herein by reference in its entirety.

BACKGROUND OF THE INVENTION

Technical Field

The present invention relates to a playback device for an aircraft to be mounted in an aircraft and which plays back at least either videos or sounds.

Related Art

Playback devices for playing back videos and sounds are mounted in an aircraft in order to improve services for passengers and transmit security information to the passengers. Since the aircraft frequently undergoes large vibrations in the middle of a flight or during takeoff, a playback device for an aircraft is required to have high vibration resistance. Moreover, since the aircraft stays on standby at an airport in a thermal area, the aircraft playback device is also required to have heat resistance.

For these reasons, a plurality of cooling techniques have already been proposed to dissipate heat quickly from a heat source (e.g., a circuit board, a power unit, and others) incorporated in the playback device and efficiently inhibit an increase in temperature of the playback device.

However, in an existing cooling mechanism, a cooling fan is often placed in close proximity to or in contact with a periphery of a casing. Moreover, in the existing cooling mechanism, an inlet for taking in air and an outlet for releasing air are provided on respective sides of a rotating shaft of a fan. The heat source is interposed between the inlet and the outlet. Thus, the existing cooling mechanism that lets air out in substantially a straight manner poses many limitations on a layout relationship between the cooling fan and the heat source, thereby providing a low degree of design freedom.

Such limitations on the layout of the cooling fan and the heat source pose a great problem on the aircraft playback device that includes many members whose positions cannot be changed in view of a design, such as dampers for vibration control and setscrews for fixing the playback device in the cabin.

JP H11-112177 A describes a technique of causing air used for forcedly cooling a first heating member (a transistor) by air to collide with a guide plate positioned behind a cooling fan, thereby diverting a direction of the air; letting the air out from an outlet formed in a case; and promoting natural-air-cooling of a second heating member (an IC) placed behind the guide plate by utilization of a negative pressure developing around the outlet. According to the technique, the direction of an exhaust stream is changed by the guide plate, so that a degree of design freedom can be improved to some degree.

However, according to the technique stated in JP H11-112177 A, the first heating member is forcedly cooled by air by utilization of an intake stream that occurs as a result of air, which flows into an inlet formed in the casing, being drawn by the cooling fan. In order to enhance a cooling effect of the intake stream as mentioned above, the quantity of air flowing in through the inlet must be maximized. To this end, a rotation axis of the cooling fan and the inlet must be aligned in a row. Namely, a sufficient improvement in degree of design freedom cannot be attained by the technique, described in JP H11-112177 A, of cooling the first heating member by the intake stream. According to JP H11-112177 A, the inlet and the outlet are formed only in one position. Hence, the quantity of inflow and outflow air is small. Further, fins of the heat sink extend in a vertical direction with respect to an air stream occurring above the heat sink. Since the air stream is hindered by the fins and becomes likely to build up, cooling efficiency cannot be said to be high.

Accordingly, the present invention provides a playback device for an aircraft that holds a high level of cooling efficiency and achieves a higher degree of design freedom.

SUMMARY

A playback device for an aircraft to be mounted in an aircraft of the present invention is a playback device which plays back at least either videos or sounds, the playback device comprising: a casing; a first heat source; a second heat source arranged at a position away from the first heat source in a first direction; a heat sink attached to the first heat source; a cooling fan that is arranged on an opposite side of the second heat source with reference to the first heat source and spaced from a periphery of the casing and that sends an exhaust stream to the heat sink; a partition interposed between the first heat source and the second heat source; and a first outlet that is formed on each of two mutually-opposed surfaces of the casing in a second direction orthogonal to the first direction and that lets out the exhaust stream diverged in two directions upon collision against the partition after passing through the heat sink.

In a preferred mode, the heat sink has a plurality of fins arranged at a space in the second direction, which is larger than a space in the first direction. In another preferred mode, the heat sink further has a first inlet which is formed on each of two surfaces of the casing opposing each other in the second direction and through which the air to be drawn by the cooling fan passes, wherein the cooling fan draws the air flowing from both sides in the second direction.

In still another preferred mode, internal space of the casing is separated by the partition into a first space where the first heat source is placed and a second space where the second heat source is placed; and the partition blocks an air flow between the first space and the second space. In this case, it is desirable that a second inlet and a second outlet for letting in and out air for cooling the second heat source be formed at positions on the periphery of the casing where the second space is formed.

According to the present invention, the first heat source is cooled by the exhaust stream, and the exhaust stream is brought into collision with the partition, thereby diverging into two directions. Therefore, a degree of design freedom can be increased further while a high level of cooling efficiency is maintained.

The invention will be more clearly comprehended by reference to an embodiment provided below. However, the embodiment provided below is illustrative, and the scope of the invention is not limited to the embodiment.

BRIEF DESCRIPTION OF THE DRAWINGS

A preferred embodiment of the present invention will be described in detail by reference to the following drawings, wherein.

DETAILED DESCRIPTION

Figure 1:
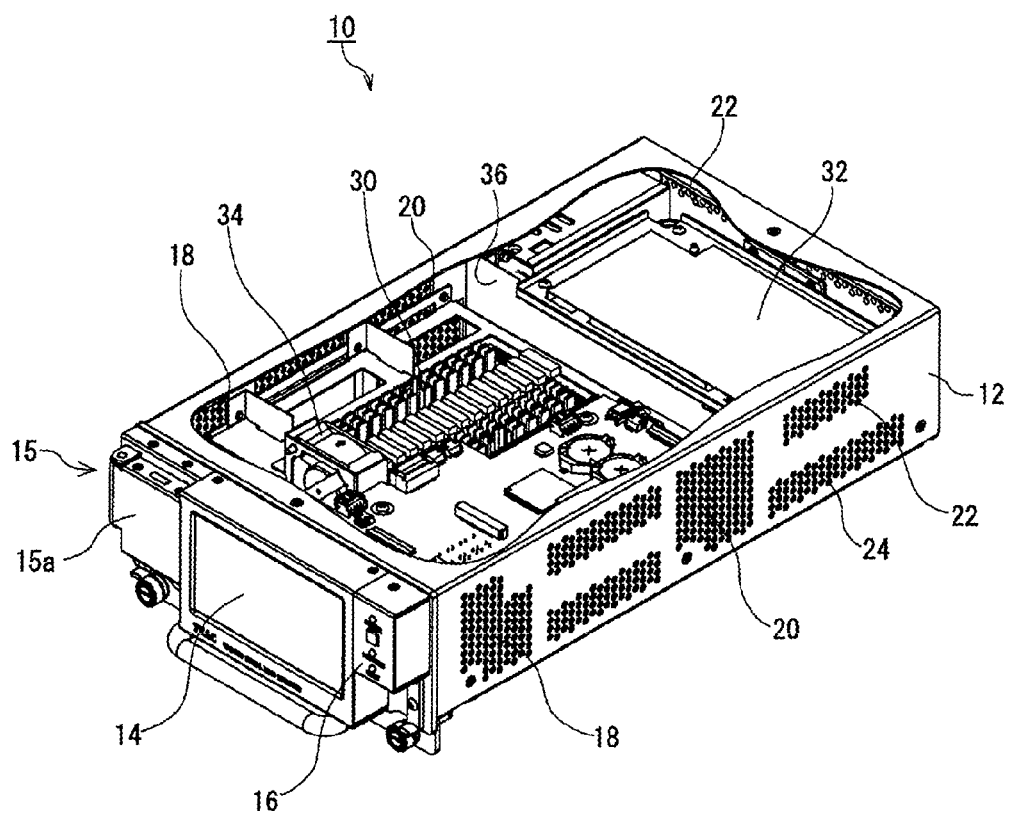
FIG. 1 is a perspective view of a playback device for an aircraft of an embodiment of the present invention.
Figure 2:
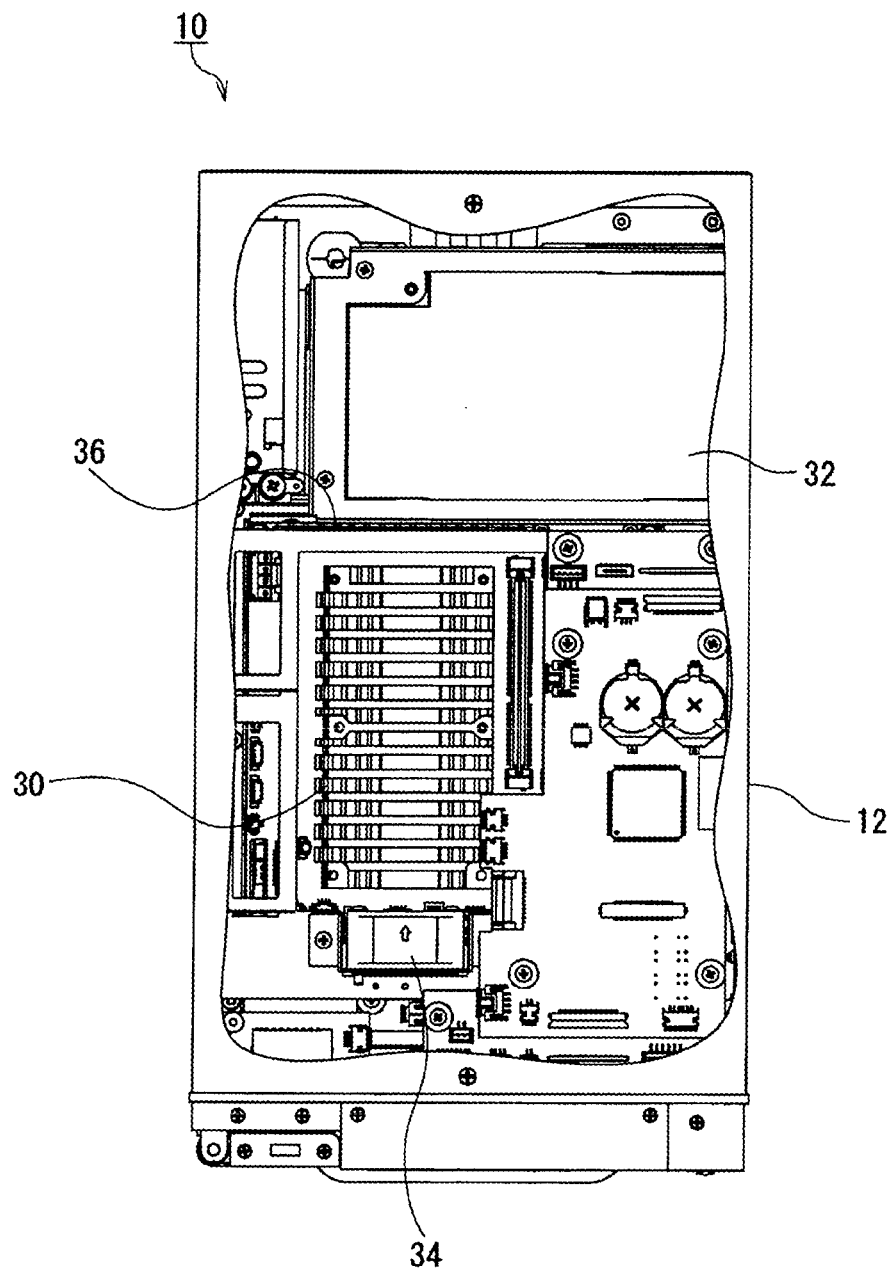
FIG. 2 is a plan view of the playback device.
Figure 3:
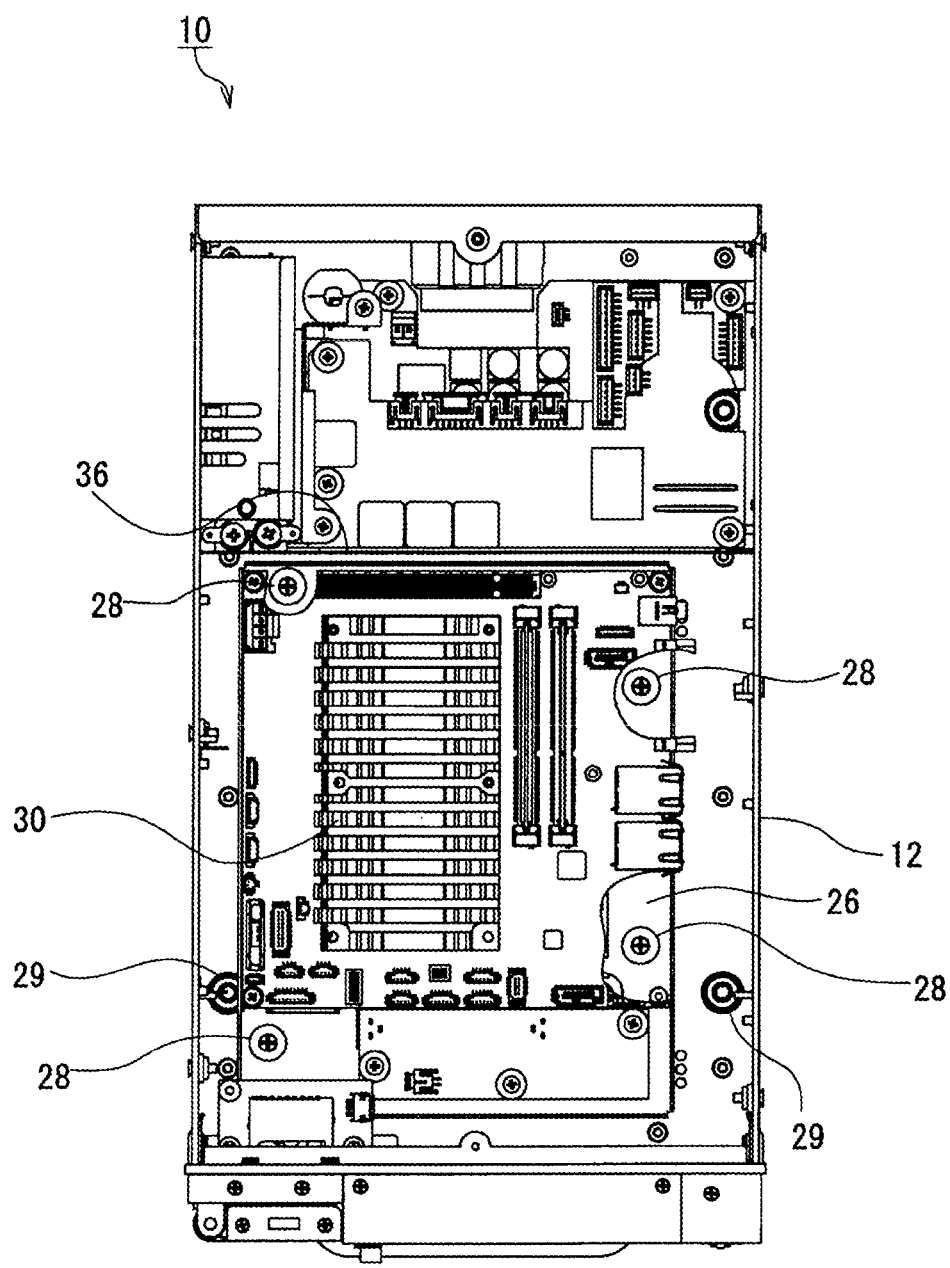
FIG. 3 is a partially-broken plan view of the playback device from which some parts are removed.

An embodiment of the present invention is now described hereunder by reference to the drawings. FIG. 1 is a partially-broken perspective view of a playback device 10 for an aircraft which is the embodiment of the present invention. FIG. 2 is a plan view of the playback device 10. FIG. 3 is a plan view of the playback device 10 that is partially cut away or broken to make a circuit board 26 and a vibration-isolation damper 28 visible. An illustration of a ceiling of a casing 12 is omitted from both FIG. 2 and FIG. 3.

The playback device 10 is a device which plays back sounds and videos with a view to improving service to passengers or offering security information to the passengers, and others. The playback device 10 has the essentially-box-shaped casing 12. A monitor 14 for displaying videos, a control panel 16 for receiving a user's instruction, and others, are arranged on a front surface of the casing 12. Of the playback device 10, the casing 12 is housed and secured within a housing space set in an airframe. Only the front portion of the playback device 10, such as the monitor 14, the control panel 16, a recording medium attachment section 15, and the like, are exposed outside. The recording medium attachment section 15 is provided with a slot (not shown) into which a recording medium, such as a memory card on which playback contents are recorded, is to be inserted. A reclosable door 15a usually closes the recording medium attachment section 15. The recording medium attachment section 15 may also be equipped with a connection terminal (such as a USB or an IEEE1394 interface) used for maintenance of the playback device 10 from the outside.

The casing 12 is formed by combination of a plate material made of a material having strength, such as metal. As is obvious from FIG. 1 to FIG. 3, the casing 12 of the present embodiment assumes the shape of a rectangular parallelepiped whose longitudinal length is greater than its widthwise length. Hereunder, the longitudinal direction is referred to as a "first direction," and the widthwise direction orthogonal to the first direction is referred to as a "second direction."

A plurality of through holes for establishing mutual communication between the inside and the outside of the casing 12 are formed in two faces, which oppose each other in the second direction, and a rear surface of the casing 12. The through holes make up first inlets 18 and a second inlet 24 for letting in external air into the casing 12 and a first outlets 20 and a second outlet 22 for letting out the air. This will be described in detail later. Mount holes 29 for securing the playback device 10 to the airframe of the aircraft are formed in a bottom surface of the casing 12 (see FIG. 3). Positions of mount holes 29 are fixed according to a type of an aircraft and are unchangeable.

The casing 12 accommodates a circuit board 26 for performing various arithmetic processing, a heat sink 30 implemented on the circuit board 26, a cooling fan 34 for forcedly cooling the circuit board 26 by air, the vibration-isolation damper 28 for holding the circuit board 26, and other components, in a floating manner, a power unit 32 for feeding electric power to the circuit board 26, and the like.

Figure 4:
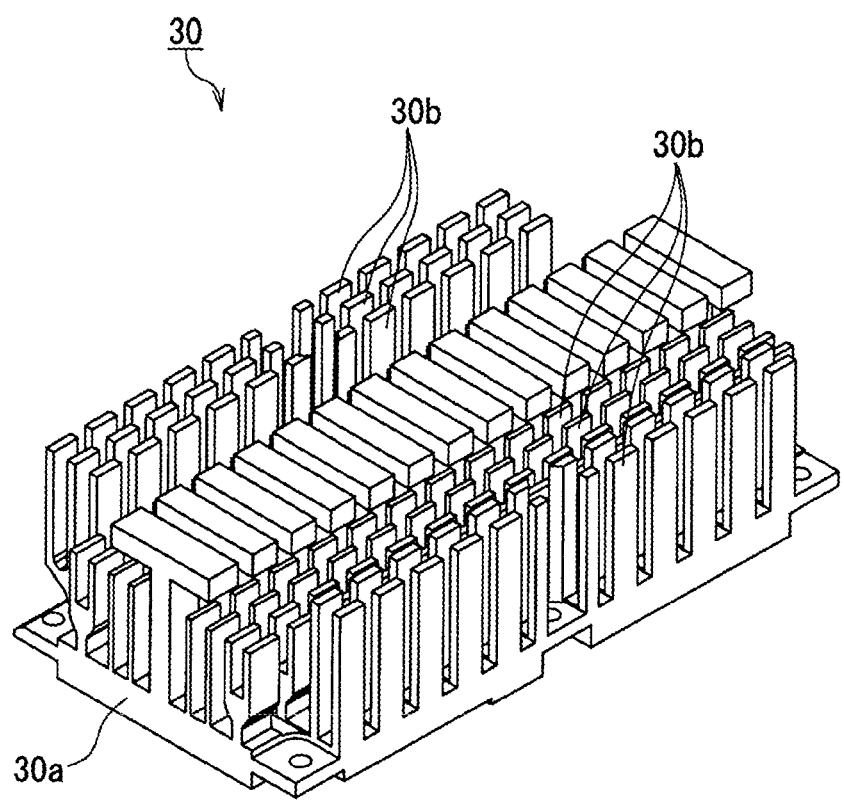
FIG. 4 is a perspective view of a heat sink.

The circuit board 26 is a printed circuit board on which a plurality of circuit elements, such as a CPU, memory, and a diode, are implemented. The circuit board 26 is placed such that a mount surface with the plurality of circuit elements mounted thereon faces the bottom surface of the casing 12. The heat sink 30 for dissipating heat of the circuit board 26 is attached to an opposite side of the mount surface of the circuit board 26. The heat sink 30 is formed from a material exhibiting a superior heat transfer characteristic; for instance, aluminum. FIG. 4 is a perspective view of the heat sink 30 used in the present embodiment. As illustrated in FIG. 4, the heat sink 30 of the present embodiment has a base 30a to be implemented on the circuit board 26 and a plurality of fins 30b extending up from the base 30a. The plurality of fins 30b are arranged at space in an array pattern and in both the second and first directions. The plurality of fins 30b are arranged in such a way that long sides of a cross section of each fin 30 are aligned in parallel to a longitudinal direction (the first direction) of the heat sink 30.

The circuit board 26 is held in a floating manner by the four vibration-isolation dampers 28. All of the four vibration-isolation dampers 28 are naturally situated at positions so as to avoid the mount holes 29. The positions of four vibration-isolation dampers 28 are determined in consideration of the centroid of the circuit board 26 on which the heat sink 30 is implemented so that vibrations propagating to the circuit board 26 can effectively be lessened. The playback device 10 to be mounted on the aircraft is required to be superior to the general-purpose playback device 10 in terms of vibration resistance. Accordingly, the location of the vibration-isolation damper 28 is more strictly limited such that a much higher vibration-isolation effect is yielded.

The power unit 32 is implemented on the rear surface of the circuit board 26; namely, a position away in the first direction. A partition 36 for dividing the interior of the casing 12 into two pieces of space is placed between the power unit 32 and the circuit board 26. The partition 36 is a thin plate standing substantially upright on the bottom surface of the casing 12. A width and a height of the partition 36 are essentially equal to an inner width and an inner height of the casing 12. Therefore, an airflow between the space where the circuit board 26 is placed and the space between the power unit 32 is placed is considerably blocked as a result of provision of the partition 36. Consequently, the air heated in surroundings of the circuit board 26 is effectively prevented from flowing into surroundings of the power unit 32.

The cooling fan 34 is placed in front of the heat sink 30 and the circuit board 26. Therefore, in the present embodiment, the cooling fan 34, the circuit board 26 having the heat sink, the partition 36, and the power unit 32 can be said to be aligned in a row along the first direction. The cooling fan 34 sends air to the heat sink 30 by making rotations around a rotation axis parallel to the first direction, thereby forcedly cooling the circuit board 26 by air. In the present embodiment, an exhaust stream from the cooling fan 34 is sent to the heat sink 30, thereby forcedly cooling the circuit board 26 by air.

In each of right and left side surfaces of the casing 12, the first inlet 18 through which the cooling fan 34 draws in air is formed at a position slightly ahead of the cooling fan 34. The first outlet 20 for letting out an exhaust stream that has passed through the heat sink 30 and collided with the partition 36 is formed at a position behind the first inlet 18 and ahead of the partition 36. Moreover, on the right side surface of the casing 12, the second inlet 24 for naturally cooling the power unit 32 by air is formed rearward of the partition 36. The second outlet 22 for letting out air is formed above the second inlet 24 and in the rear surface of the casing 12.

As is obvious from the above description, in the present embodiment, the partition 36 is formed between the circuit board 26 and the power unit 32. The circuit board 26 is forcedly cooled by air with the cooling fan 34, and the power unit 32 is naturally cooled by air. The first inlets 18 and the first outlets 20 for forced-air-cooling purposes are not positioned on a rotation axis of the cooling fan 34 but on both sides of the cooling fan 34. Reasons why such a configuration is adopted are now described.

Of the playback device 10, the circuit board 26 and the power unit 32 can be said to be a heat source that operates while generating heat. Since the circuit board 26 and the power unit 32 cause a breakdown or faulty operation when excessively heated, heat developing from the heat sources (the circuit board 26 and the power unit 32) is desired to be quickly dissipated. In particular, aircraft frequently stay on standby for long hours at an airport in a high-temperature region and are vulnerable to thermal load.

Accordingly, a configuration having hitherto widely been adopted is that the inlets (or outlets), the cooling fan, the heat source, and the outlets (or inlets) are arranged in a row to forcedly cool the heat sources by air. At this time, the cooling fan is often arranged in close proximity to or in contact with the casing. In the case of such a configuration, the heat sources can be efficiently cooled.

However, in the case of such a configuration, a limitation is imposed on the layout of the heat sources and the cooling fan, which in turn causes a great decrease in degree of design freedom. In particular, in the case of the aircraft playback device, the inlets and the outlets cannot be formed on the front surface of the casing, in view of design. The playback device is mounted and fixed on a stationary surface in the aircraft. Hence, when consideration is given to the efficiency of drawing and ventilation of air, in many cases neither the inlets nor the outlets can be formed on the bottom surface of the casing. In short, when the related-art cooling structure in which the inlets (or the outlets), the cooling fan, the heat source, and the outlets are aligned in a row is applied to the aircraft playback device, the inlets can be formed only on either the right or left side surface of the casing, and the outlets can be formed only on either the right or left side surface of the casing. Thus, the cooling fan and the heat source have to be placed between the inlets and outlets.

However, in the case of the aircraft playback device, requirements to be taken into account are not only the layout of the cooling members but also the layout of previously-mentioned mount holes and the vibration-isolation dampers, and others. As mentioned previously, the layout of the mount holes is substantially fixed according to the type of an aircraft, and there is little chance to change the layout and the positions. As a consequence, great difficulty is encountered in aligning the inlets, the cooling fan, the heat sources, and the outlets in a row while avoiding occurrence of interference with the mount holes and the vibration-isolation dampers.

In the playback device, the power unit as well as the circuit board also acts as a heat source that develops heat. The power unit does not generate as much heat as the circuit board does. Therefore, in normal conditions, the power unit can be sufficiently cooled by natural-air cooling. However, when the power unit is set in the same space where the circuit board is set, the power unit is exposed to hot air flowing from the circuit board and may experience an excessive temperature rise. This problem can be solved by separately placing a cooling fan for cooling the power unit and also by forcedly cooling the power unit by air. However, in this case, the addition of the cooling fan raises new problems, such as a cost increase and an increase in size.

Figure 5:
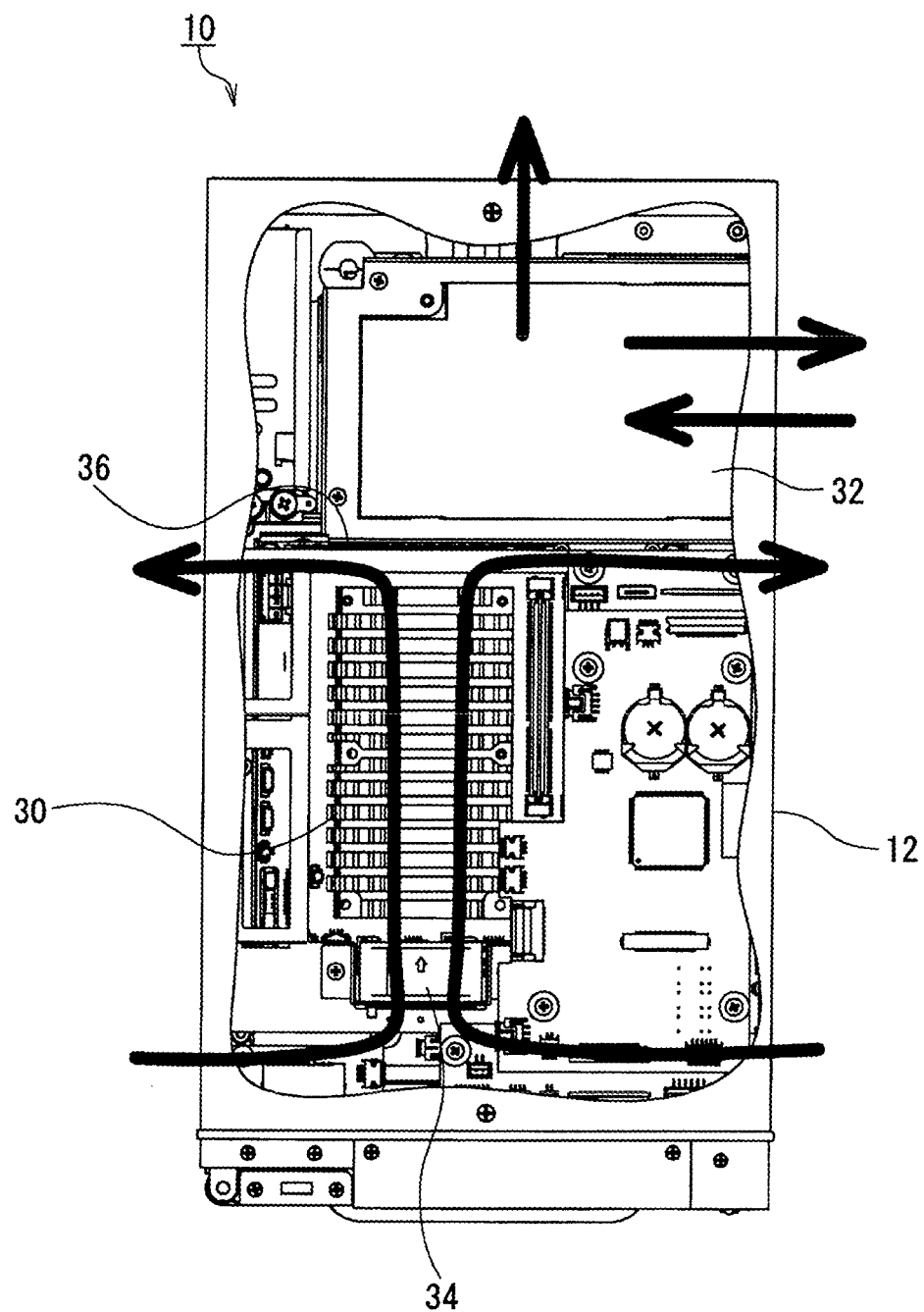
FIG. 5 is an illustration showing an air flow.

In the present embodiment, the partition 36 is interposed between the circuit board 26 and the power unit 32 to solve the problem, and the first inlets 18 and the first outlets 20 for forced-air cooling are placed on both sides of the cooling fan 34. An air flow, which will arise in such a configuration, is now described by reference to FIG. 5.

As is obvious from the descriptions provided thus far, in the present embodiment the first inlets 18 are provided on both sides of the cooling fan 34. Put another way, there are provided a total of two first inlets 18, one on one of the two mutually-opposed surfaces of the casing 12 and the other on the remaining surface. When the cooling fan 34 is rotationally driven in this state, outside air flows into the cooling fan 34 by way of the two, right and left, first inlets 18. At this time, the cooling fan 34 can draw a large quantity of air because there are two first inlets 18. An exhaust stream from the cooling fan 34 flows in the direction of the rotation axis of the cooling fan 34; namely, toward the heat sink 30 situated ahead of the cooling fan 34.

The plurality of fins 30b making up the heat sink 30 are arranged at a space in the second direction orthogonal to the rotation axis in such a way that long sides of a cross section of each fin 30b become parallel to the first direction parallel to the rotation axis. Accordingly, the space among the fins 30b acts as passages through which the exhaust stream flows. Further, the passages can be assured to be wide (the space among the fins 30b achieved in the first direction is larger than the space among the second fins 30b achieved in the second direction), so that the exhaust stream smoothly flows deep into the heat sink 30. As a result, the heat sink 30 is effectively dissipated by the exhaust stream of the cooling fan 34.

The exhaust stream having become hot while passing through the heat sink 30 collides with the partition 36 disposed behind the heat sink 30, diverging into two sides along the second direction. In other words, the hot exhaust stream does not flow into the layout space of the power unit 32 but is diverted to two sides along the second direction. A total of two first outlets 20 are provided on the two mutually-opposed surfaces of the casing 12; namely, one on each surface. The thus-diverted exhaust streams exit from the two first outlets 20 to the outside. Since the outlets 20 are two, the quantity of exhaust stream can be increased when compared with the case where there is one outlet 20, which in turn enables enhancement of the heat dissipation effect. In the case where the outlets 20 are on both sides, a distance over which the exhaust stream reaches to the outside can be shortened when compared with the case where the outlet is provided only on one side. Consequently, the exhaust stream having become hot while passing through the heat sink 30 becomes less likely to stay in the casing 12, which can improve the heat dissipation effect further.

As is obvious from the above description, the partition 36 diverts the direction of the exhaust, which eliminates a necessity to place the first outlets 20 on the rotation axis of the cooling fan 34. Hence, the degree of design freedom can be enhanced. Further, the hot exhaust stream having cooled the circuit board 26 is prevented from flowing into the layout space of the power unit 32, by provision of the partition 36. As a consequence, the temperature rise of the power unit 32, which would otherwise be caused by thermal dissipation of the circuit board 26, is inhibited. Hence, the power unit 32 itself can be cooled by natural air. Therefore, in the present embodiment, the power unit 32 is naturally cooled by the airflow that flows into the casing 12 from the second inlet and exits from the second outlet 22 to the outside of the casing 12.

In the embodiment, the exhaust stream is used to cool the circuit board 26 instead of the air stream drawn by the cooling fan 34. The reasons for this are as follows. When cooling is performed by the air stream drawn by the cooling fan, the rotation axis of the cooling fan and the inlets must be arranged in a straight line in order to maximize the quantity of air flowing from the inlets. Namely, in the case of an intake air cooling mode, a configuration in which the inlets are arranged on both sides of the cooling fan cannot yield a sufficient cooling effect. In the meantime, in the case of an exhaust stream cooling mode, only an objective to be cooled (the heat source) is required to be arranged on the rotation axis of the cooling fan. The outlets and the inlets do not need to be arranged in a straight line along the rotation axis. Consequently, as in the case of the embodiment, a high cooling effect can be yielded even when the first outlets 20 and the first inlets 18 are arranged on both sides of the cooling fan 34.

As is obvious from the above description, the embodiment adopts the configuration in which the partition 36 is interposed between the two heat sources (the circuit board 26 and the power unit 32) and in which the exhaust stream having passed through the first heat source (the circuit board 26) is caused to collide against the partition 36 so as to diverge into the two directions on both sides. Hence, the cooling fan 34, the heat source, the outlets 20, and the inlets 18 do not need to be arranged in a straight row. Further, the first heat source is thermally dissipated by the exhaust stream and let out from the outlets 20 provided on both sides of the partition 36, whereby the heat dissipation effect can be enhanced further. As a consequence, in the embodiment, the degree of design freedom can be improved while a high degree of cooling efficiency is maintained.

The foregoing configuration is an example. The configuration may also be changed, as required, as long as the cooling fan 34, the first heat source, the partition 36, and the second heat source are arranged in this sequence; the first heat source is cooled by the exhaust stream from the cooling fan 34; and the outlets 20 for releasing the exhaust stream from the cooling fan 34 to the outside are provided on both sides of the partition 36.

For instance, the first inlet 18 can also be only one. In addition, although the power unit 32 is naturally cooled by air in the present embodiment, the power unit 32 may also be forcedly cooled by air by the cooling fan 34. The heat sink 30 used for dissipating the circuit board 26 can also be modified freely in terms of a shape, so long as the heat sink 30 has the plurality of fins 30b arranged at space in the direction orthogonal to the rotation axis of the cooling fan 34. Moreover, the present embodiment adopts the configuration in which the playback device plays back both sounds and videos. However, the only requirement for the playback device is to be able to play back at least either sounds or videos. Further, in the present embodiment, the circuit board and the power unit are deemed as heat sources. However, the heat sources are not limited to them. Naturally, the heat source can also be another member, so long as the member generates heat.

What is claimed is:

1. A playback device for an aircraft to be mounted in an aircraft which plays back at least either videos or sounds, the playback device comprising:
    a casing;
    a first heat source;
    a second heat source arranged at a position away from the first heat source in a first direction;
    a heat sink arranged on and attached to the first heat source;
    a partition interposed between the first heat source and the second heat source, as an element separated from the first heat source;
    a cooling fan that is arranged on an opposite side of the partition with reference to the first heat source and spaced from a periphery of the casing and that sends an exhaust stream to the heat sink;
    and
    a plurality of first outlets, wherein at least one of the first outlets is formed on a first surface of the casing and at least one of the first outlets is formed on a second surface of the casing that is opposite the first surface of the casing in a second direction that is orthogonal to the first direction and the plurality of first outlets let out the exhaust stream diverged in two directions upon collision against the partition after passing through the heat sink.

2. The playback device for an aircraft according to claim 1, wherein the heat sink has a plurality of fins arranged spaced apart in both the first direction and the second direction; and
    a space at which the fins are spaced apart in the second direction is larger than a space at which the fins are spaced apart in the first direction.

3. The playback device for an aircraft according to claim 1, further comprising:
    a plurality of first inlets, wherein at least one of the first inlets is formed on the first surface of the casing and at least one of the first inlets is formed on the second surface of the casing that is opposite the first surface of the casing in the second direction and through which the air drawn by the cooling fan passes, wherein
    the cooling fan draws the air flowing from both the first surface and the second surface in the second direction.

4. The playback device for an aircraft according to claim 1, wherein internal space of the casing is separated by the partition into a first space where the first heat source is placed and a second space where the second heat source is placed; and
    the partition blocks an air flow between the first space and the second space.

5. The playback device for an aircraft according to claim 4, wherein a second inlet and a second outlet for letting in and out air for cooling the second heat source are formed at positions on the periphery of the casing where the second space is formed.

* * * * *